United States Patent
Voldman

[19]

[11] Patent Number: 5,945,713

[45] Date of Patent: *Aug. 31, 1999

[54] ELECTROSTATIC DISCHARGE PROTECTION CIRCUITS FOR MIXED VOLTAGE INTERFACE AND MULTI-RAIL DISCONNECTED POWER GRID APPLICATIONS

[75] Inventor: Steven Howard Voldman, Burlington, Vt.

[73] Assignee: International Business Machines Corporation, Armonk, N.Y.

[ * ] Notice: This patent is subject to a terminal disclaimer.

[21] Appl. No.: 08/763,998

[22] Filed: Dec. 12, 1996

Related U.S. Application Data

[62] Division of application No. 08/312,255, Sep. 26, 1994, abandoned.

[51] Int. Cl.[6] .................................................. H01L 23/62
[52] U.S. Cl. ............................................ 257/355; 257/360
[58] Field of Search .................................. 257/355, 360, 257/361

[56] References Cited

U.S. PATENT DOCUMENTS

| | | | |
|---|---|---|---|
| 5,157,573 | 10/1992 | Lee et al. | 361/56 |
| 5,237,395 | 8/1993 | Lee | 257/360 |
| 5,246,872 | 9/1993 | Mortensen | 437/51 |
| 5,378,941 | 1/1995 | Nishio et al. | 257/355 |
| 5,389,811 | 2/1995 | Poucher et al. | 257/360 |
| 5,477,414 | 12/1995 | Li et al. | 361/56 |
| 5,521,789 | 5/1996 | Ohannes et al. | 361/111 |
| 5,535,086 | 7/1996 | Mentzer | 361/91 |
| 5,568,346 | 10/1996 | Orchard-Webb | 361/58 |
| 5,610,791 | 3/1997 | Voldman | 361/56 |

*Primary Examiner*—David B. Hardy
*Attorney, Agent, or Firm*—Howard J. Walter, Jr.

[57] ABSTRACT

On-chip ESD protection for semiconductor chips with mixed-voltage interface applications and internal multiple power bus architecture are described. ESD robustness in shallow trench isolation 0.50- and 0.25-micron channel-length CMOS technologies is presented in the form of ESD structures and circuits including hybrid three-rail and mixed voltage interface embodiments.

4 Claims, 8 Drawing Sheets

ELECTROSTATIC DISCHARGE PROTECTION CIRCUITS FOR MIXED VOLTAGE INTERFACE AND MULTI-RAIL DISCONNECTED POWER GRID APPLICATIONS

This application is a divisional application of application Ser. No. 08/312,255 filed Sep. 26, 1994, now abandoned.

BACKGROUND OF THE INVENTION

1. Field of the Invention

This invention relates to semiconductor devices and more particularly to circuits designed to protect such devices from damage due to undesirable voltage conditions which can cause catastrophic damage to circuit elements, commonly referee to as electrostatic discharge (ESD) protection and overvoltage protection circuits and more particularly to on-chip ESD protection for semiconductor chips with mixed voltage interface applications and internal multiple power bus architecture.

2. Description of the Prior Art

The shrinking of MOSFET dimensions used in advanced integrated circuit technology for constructing a high circuit density and achieving performance objectives has required reduced power-supply voltages. With increased interest in portability, reduced power consumption in CMOS circuits is an important issue. Because power consumption is a function of $CV^2f$, the focus has been on reducing both capacitance, C, and power supply voltage, V, as the transition frequency increases. As a result, dielectric thickness continues to be scaled with the power-supply voltage. Power-supply reduction continues to be the trend for future low-voltage CMOS device scaling in advanced semiconductors.

The effect of MOSFET scaling on ESD protection has manifested itself in three ways: the shrinking of ESD structures and I/O circuitry, mixed-voltage interface environments, and noise isolation vs. ESD tradeoffs. On the first issue, reducing the area for both ESD structures and I/O circuitry makes structures more vulnerable; on the second, dual-voltage chips and mixing chip types forces new ESD structures to satisfy I/O needs; on the third issue, lower power-supply voltages are driving new bus architectures to isolate peripheral noise from internal core logic introducing new ESD concerns.

MIXED VOLTAGE INTERFACE (MVI) ENVIRONMENTS

Today's computer architecture requires the interfacing of semiconductor chip or sub-systems with different internal power-supply voltages. The semiconductor-chip power-supply voltages are different because of the technology generation mix, technology types, and applications. Dynamic random access memory (DRAM) chips, whose geometrical dimensions are typically the most aggressive, must communicate with other logic and microprocessor chips. Microprocessors must communicate with co-processors, analog circuits, printers and other input/output (I/O) circuits. With the mix of power-supply voltages, chip-to-chip interface I/O circuitry must be designed to avoid electrical overstress and prevent undesirable current leakage paths that create system-level power loss. If the I/O circuit area remains a small percentage of total die size, the I/O circuits may operate at the intrinsic defect-free limit of the dielectrics. As a result, dielectric thicknesses continue to be scaled with MOSFET scaling, even in dual-voltage chips.

ESD circuits must also satisfy the same interface I/O conditions and constraints. A system-level constraint placed on ESD and circuit designers is that both the ESD device and external circuits are designed to prevent voltage overstress or forward-biasing in MVI environments when both chips are powered up. For example, in 3.3/5.0 V MVI, double-diode ESD networks cannot be used; but, a diode string is acceptable. In power-up, the 3.3 V supply must be raised prior to the 5 V supply, creating a power-up sequencing constraint.

An additional system-level constraint on ESD protection and I/O networks is the desired feature that subsystems not draw current from the primary powered-up system when the subsystem is either in a power-up mode or shut off. This concept can be generalized as satisfying the power boundary condition that no power be drawn from the main system when peripheral subsystems are turned off. ESD protection circuits and I/O networks that satisfy these conditions are power-up sequence-independent MVI networks.

POWER-UP SEQUENCE-DEPENDENT CMOS DRIVER CIRCUITS

FIG. 1 shows a standard CMOS off-chip driver (OCD) circuit including double-diode ESD devices. Such circuits have been used to provide ESD protection for data output pad 10 which is driven by MOSFETs T1 and T2. This driver cannot be used for MVI environments because the p-channel MOSFET will be forward-biased when the pad voltage exceeds the power-supply voltage; if the power supply is shut off, forward-biasing will also occur and draw current from external sources that are attached to its input pad. For this class of OCD designs, double-diode networks, resistor/NFET pi-networks and other ESD devices can be used without restriction.

For MVI environments, CMOS OCD circuits use series p- and n-channel MOSFETs as shown in FIG. 2. The use of two series connected p-channel MOSFETs T3 and T4 avoid forward-biasing when voltage on chip pad 10 is raised above the power supply. Using two n-channel MOSFETs T3 and T4 in series avoids hot-electron degradation caused by electrical over-stress. From an ESD perspective, the p-channel MOSFETs form two series diodes to the Vdd power rail. ESD robustness of the OCD is limited by the diode series resistance. The series resistance of the five diode protection circuit D3 is dominated by the n-well sheet resistance. For positive-mode ESD protection, series n-channel MOSFETs are also advantageous for delaying secondary thermal breakdown. But, for negative modes with separate ground power busses, it is a severe disadvantage because there is no current path to the NFET source. The OCD circuit is not power-up sequence-independent because p-channel MOSFETs forward-bias when external sources are well above the power supply. For these MOSFET OCD drivers, diode string ESD networks can be used. Power-up sequence-dependent MVI ESD networks are any design that, by grounding the power supply, leads to continuous dc current flow out of the powered-up part of the network.

Double-diode networks are power-up sequence-dependent networks that cannot be used for mixed-voltage interfaces; diode strings are power-up sequence dependent networks that can be used for MVI environments.

POWER-UP SEQUENCE DEPENDENT NON-MVI ESD NETWORKS

To achieve ESD robustness in MVI diode-string circuits, power-up sequence-dependent double-diode ESD circuits must be understood. ESD double-diode protection networks have been designed in 0.5- and 0.25-micron channel length CMOS technologies. An analytical model was developed explaining the ESD failure results. The analytical model and the experimental results are consistent with the Wunsch-Bell model in the adiabatic regime. From this benchmark structure, two important points are evident. First, the n-well design and sheet resistance are key to achieve ESD robustness. Second, ESD robustness is degraded due to junction scaling. P+ junction scaling and lower semiconductor thermal budgets decrease the distance between the p-n metallurgical junction and titanium salicide. These effects and other scaling issues also reduce ESD robustness with technology scaling. Additionally, as MOSFET transistors are scaled from 0.5- to 0.25-micron channel length, n-channel snapback breakover and sustaining voltages decrease. Therefore, as one scales to future technologies, the series resistance of diodes must decrease.

Using optimized ESD structures, ESD robustness above 4 kV was achieved in a 0.5 micron CMOS Shallow Trench Isolation technology. A 110×40 micron non-MVI double-diode ESD network achieved an ESD robustness of greater 4.7 kV in a 3.3-V 16-Mb DRAM.

In an advanced 0.5-micron logic technology, ESD robustness of more than 6.4 kV was achieved in an SRAM chip. ESD results over 10 kV are obtainable with the Vdd power rail grounded and a positive Human Body Model (HBM) ESD impulse. ESD robustness greater than −10 kV is achieved using an n-well diode. The diode series resistance is less than 7 ohms.

POWER-UP SEQUENCE-DEPENDENT MVI ESD NETWORKS

For MVI environments, a five-diode-string ESD network can achieve ESD robustness in 3.0/5.0 V environments. Since ESD protection is dependent on the total series resistance to the Vdd power supply, the resistance of each diode must equal $R_{well}/N$ (where $R_{well}$ is the diode series resistance and N is the number of stages). For example, if a diode series resistance of 5 ohms is adequate for a double-diode circuit, approximately 1 ohm per stage is required for a five-diode-string 3.3/5.0-V tolerant MVI ESD network. Since each stage of the string must be N times larger, the area of the N-diode-string ESD structure will be $N^2$ bigger than a single diode structure. This area impact can be reduced by decreasing p+-to-n+ spacing and design optimization. Using a five-diode-string MVI ESD device, 4× larger ESD robustness of 6.3 to 10 kV was achieved relative to Vdd. This was demonstrated on an advanced microprocessor test chip.

Other solutions can also reduce the area impact of MVI ESD structures. The diode string can be made common to different input after the first diode; given that I/O drivers are placed away from I/O pads. With a 3-V and 5-V system, a 5-V pin can be brought into an I/O cell and a single diode can be attached to the 5-V pin.

POWER-UP SEQUENCE-INDEPENDENT CMOS DRIVER CIRCUITS

With increased interest in dynamically reconfigured systems and portability, the ability to shut off systems without dc power loss has become an important issue. Achieving maximum flexibility of operation modes and the ability to interface with different logic families (CMOS/TTL and ECL) are important for advanced microprocessors and logic libraries. For applications that desire power-up sequence independence or turning off sub-systems power supply, two strategies were recently developed for CMOS driver circuits: (1) p-channel MOSFETs are connected to a higher power-supply voltage and (2) active circuits are used to sense the input state to prevent forward-biased structures. U.S. Pat. No. 4,782,250 to Adams et al. teaches the use of an n-well control bias network, where the n-well of the p-channel MOSFET is biased by control circuitry connected to the input node. This circuit was further extended by Austin, Piro and Stout in their U.S. Pat. No. 5,151,619. The floating or self-bias well driver concept was extended by Dobberpuhl et al. ("200 Mhz 64-Bit Dual Issue Microprocessor," ISSCC Technical Papers, pp 106–7, 1992), to allow the driver to interface with ECL and avoid p-channel MOSFET stacked pull-up transistors in the driver stage as shown in FIG. 3. In this circuit, MOSFETs T7 and T8 represent the push-pull driver pair, Device T9 acts as a control between the output terminal 10 and the gate of T7. PMOSFET T10 acts as an N-well bias transistor The concept has also been used for fault-tolerant systems in high-reliability spacecraft systems, where powered-down redundant circuit boards cannot act as a power loss. In floating-well circuits, when the data-output node rises above the power supply, all p-channel MOSFET implants connected to the data-output node begin to forward-bias. The n-well bias control p-MOSFET gate bias turns off the p-channel MOSFET, allowing the n-well node to float. As the p-channel MOSFETS forward-bias, the n-well rises to the data-output-node voltage minus 0.7 V. The circuit in FIG. 3 uses three additional p-channel MOSFETs T13, T14 and T15 to force the n-well voltage to Vdd-power supply voltage.

POWER-UP SEQUENCE-INDEPENDENT MVI ESD NETWORKS

ESD protection circuits connected to power-up sequence-independent CMOS driver circuits must also satisfy I/O requirements. N-well-to-n-well punchthrough devices, dual-rail pnpn silicon-controlled rectifiers (SCR), and low-voltage trigger SCRs (LVTSCR) all satisfy the power-up sequence-independent conditions. Several standard ESD networks were constructed in the 0.5- and 0.25-micron channel-length shallow trench isolation CMOS technologies. Negative-mode protection concepts, used in double-diode networks, were synthesized into the SCR networks for achieving good negative-mode HBM results.

The ESD HBM results showed that, for the 0.5-micron STI defined CMOS technology with retrograde wells, the n-well-to-n-well punchthrough ESD network robustness was typically 500 to 1500 V. ESD robustness was not achieved for any dimension allowed by device ground rules. The designs varied n-well-to-n-well space from 2.6 to 3.0 micron.

SCR structures have been shown to be effective for ESD protection. Good results can be obtained in latchup sensitive technologies. Twenty to 30 synthesized and hybridized SCR networks were built in four designs using low- and high-voltage triggering techniques, see Duvuury et al., "A Synthesis of ESD Input Protection Schemes," EOS/ESD Symposium Proceedings, pp. 88–97, 1983. As a result, the current gain product is less than unity. Design A was a dual-rail SCR using a npn defined by two n-wells separated by shallow trench isolation. The p+ diffusion is connected to the n-well at the ends, using the n-well as an integrated resistor element. Design B added a lateral well-to-well npn and n-well diode for the negative-mode protection to the dual-rail SCR. Both designs demonstrated poor positive-mode protection due to high n-well breakdown voltages and poor pnpn bipolar gain. The second design demonstrated better negative mode protection. Design C was a low-voltage n-channel MOSFET-triggered dual-rail SCR based from the thick oxide design. Design D was a low-voltage n-channel MOSFET-triggered dual-rail SCR with a lateral npn and n-well diode. Even with n-channel snapback triggering the SCR, low ESD robustness is achieved. Because of a $3 \times 10^{13}/cm^2$ retrograde well dose and shallow trench isolation, the vertical pp bipolar dc gain is typically 2 and the lateral dc pnp gain is negligible. Using conventional triggering techniques (no external control circuitry), ESD protection with an SCR structure could not achieve 2 kV ESD protection to all HBM test modes in this advanced CMOS technology.

ESD protection circuits that use thick-oxide MOSFET structures are ineffective with shallow trench isolation. Attempts to implement n-channel MOSFET/resistor pi networks, SCRs, or punchthrough devices in test chips or products have demonstrated very poor ESD protection results, fabricator-to-fabricator variations or process-control issues with CMOS driver circuits. When these concepts were used to protect floating-well driver circuits, ESD robustness was better without the ESD protection circuit! These early results indicated that the floating well driver has inherent ESD robustness which could be advantageous.

ESD DESIGN COMPARISONS

There are design tradeoff considerations for each ESD design choice. The tradeoffs are electrical parametrics, area, ESD robustness, and extendibility to future technologies.

Well-to-well punchthrough devices do not require significant area but have poor ESD robustness. The breakdown and punchthrough voltages are too high to protect future thin dielectrics; and, because the n-well is attached to the I/O pad, the design capacitance is larger than diode-based ESD concepts. SCR pnpn ESD protection circuits can be built in a small design area. In a traditional SCR design, the well is attached to the input node, which increases the input-node capacitance. In dual-rail LVTSCRS, MOSFET gate capacitance also increases the ESD design capacitance. Diode-string designs require significant area but achieve good ESD robustness. In technologies with high n-well sheet resistance, diode strings have reverse amplification concerns. With retrograde n-well implants, vertical pnp bipolar gain effects can be eliminated and low series resistance is achievable. Diode strings can not be power-up sequence-independent.

Floating-well ESD protect circuits have many positive merits. The capacitance is dependent only on the p-channel MOSFET n-well control circuit gate, the p+ diode and an n-well diode. The area required for a self-bias-well ESD is much smaller than the diode-string ESD device. From an area vs. ESD robustness tradeoff, the self-bias-well concept will be favored over other design concepts in power-up sequence-dependent and independent I/O environments.

NOISE, ESD AND DISCONNECTED POWER GRIDS

Tradeoffs between on-chip noise and ESD protection are becoming a significant issue in I/O design for 0.50- and 0.25-micron channel-length CMOS technologies due to power-supply scaling with technology generations. As power-supply voltages decrease, circuits become more sensitive to on-chip noise. With the higher level of integration and larger semiconductor chips, more off-chip drivers are present on advanced microprocessors and memory chips.

As the number of I/O drivers increase and power-supply voltages decrease, noise becomes a more significant issue in DRAM and logic designs. In chips with analog function on a logic part, the analog and digital circuits are disconnected from the power grid to prevent digital noise from interfering with analog functionality. To isolates the internal circuits from OCD noise, it is also common to architect a chip with two different power grids: one for internal core circuits and the other for peripheral circuits. Isolation is achieved by establishing a different power rail for the OCD circuits and the internal circuit (Vdd(OCD) and Vss(OCD) for the OCD circuitry). Disconnected power grids can also be established to prevent sensitive circuits from electrical overstress. Power grids are also separated when there is more than one external power pin at different voltages. A common ESD solution is to use additional ESD circuits between the Vdd and Vss ground rails to establish bi-directional current paths (thick and thin dielectric MOSFETs, diode stacks, and pnpn SCRs). A power-to-ground ESD clamp protection circuit with control and/or trigger circuits can also achieve ESD protection between rails.

SUMMARY OF THE INVENTION

Accordingly, it is an object of this invention to provide improved ESD protection circuits for advanced semiconductor circuits.

It is another object of the invention to provide improved ESD protection circuit using shallow trench isolation sub-micron process technologies.

It is yet another object to provide ESD and input protection circuits capable of use in Mixed Voltage Interface applications.

According to the invention these objects may be achieved by providing ESD protection circuit between each pad and every power supply rail on a chip.

In addition, in multiple rail supply chips, input protection is provided between each rail for both positive and negative ESD pulses.

These and other objects of the invention will be more clearly understood by reference to the following drawings and description of the preferred embodiment of the invention.

DESCRIPTION OF THE PREFERRED EMBODIMENT

The preferred embodiment of the invention will be described in terms of a specific semiconductor processing environment which includes well known CMOS technology using ion implanted dopant regions including n-well regions in which p-channel devices are formed by conventional precessing. Isolation is of the type referred to as Shallow Trench Isolation (STI) as is well known in the literature.

SELF-BIASED-WELL ESD PROTECT CIRCUITS

Figure 1:
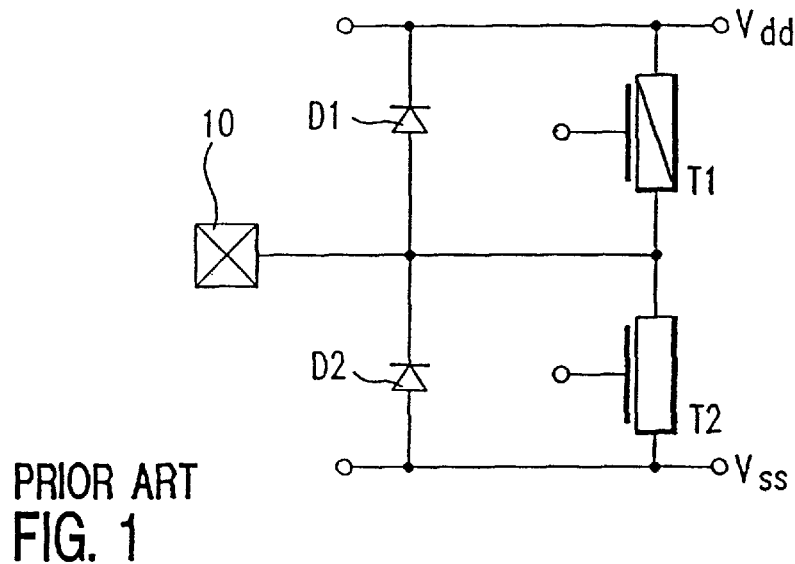
FIG. 1 is a schematic representation of a double-diode ESD protection circuit of the prior art.
Figure 2:
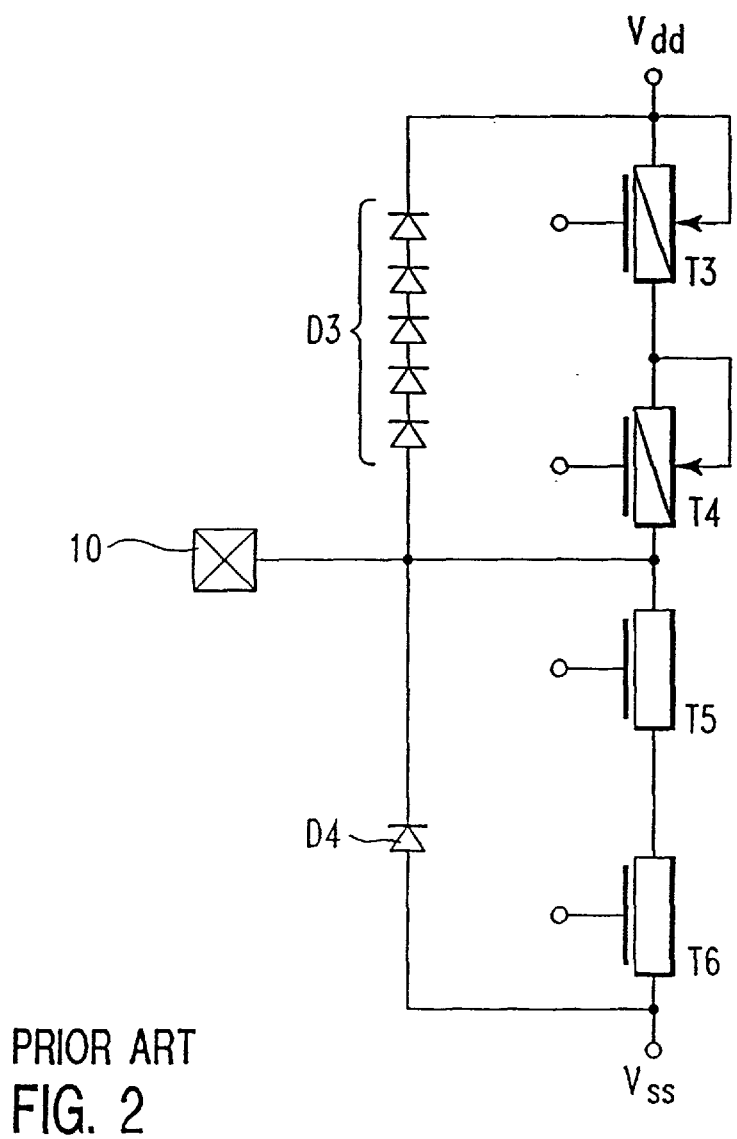
FIG. 2 is a schematic representation of a prior art ESD protection circuit using series diodes.
Figure 3:
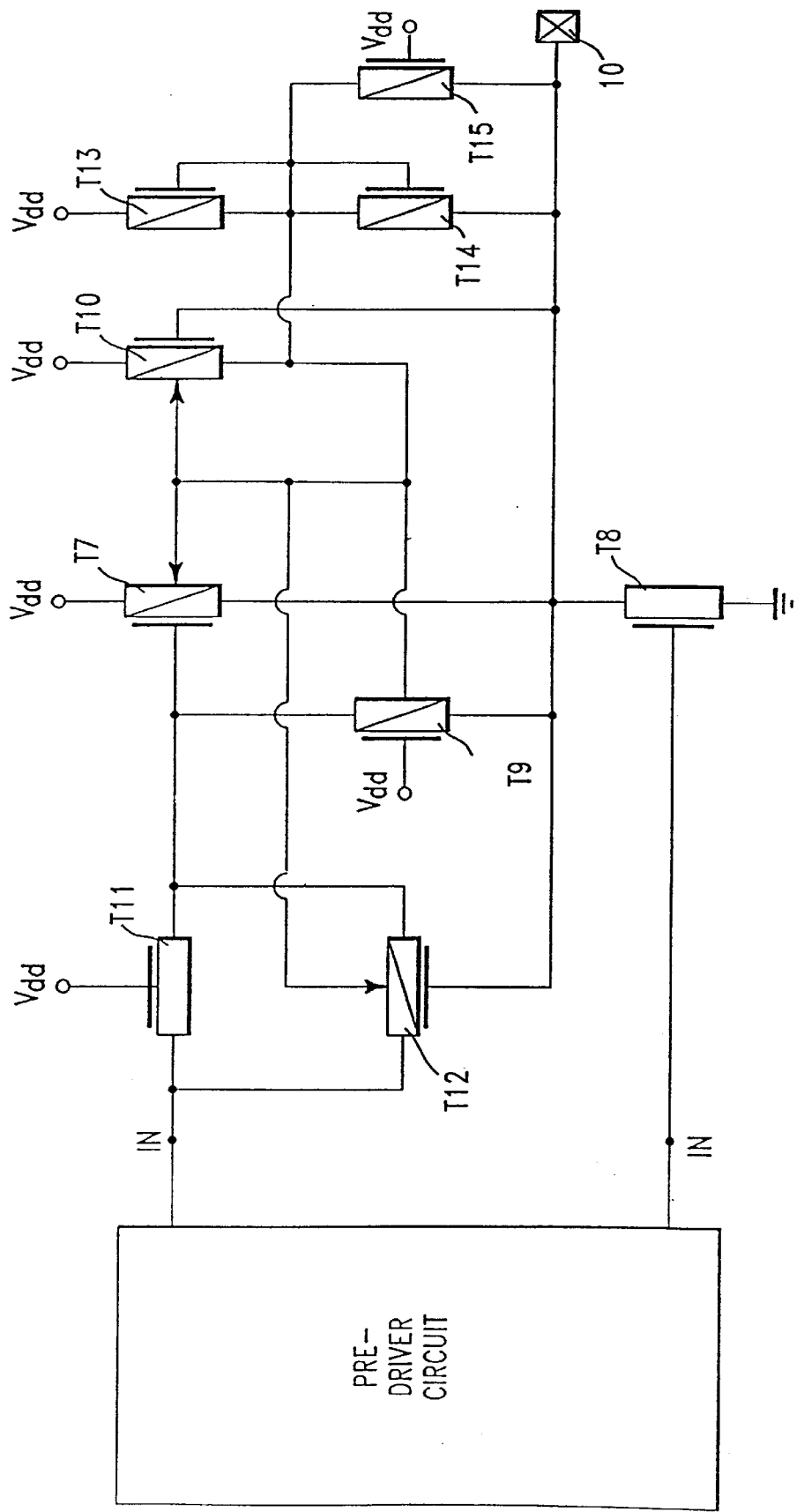
FIG. 3 is a schematic representation of a prior art off chip driver circuit using a biased well.
Figure 4:
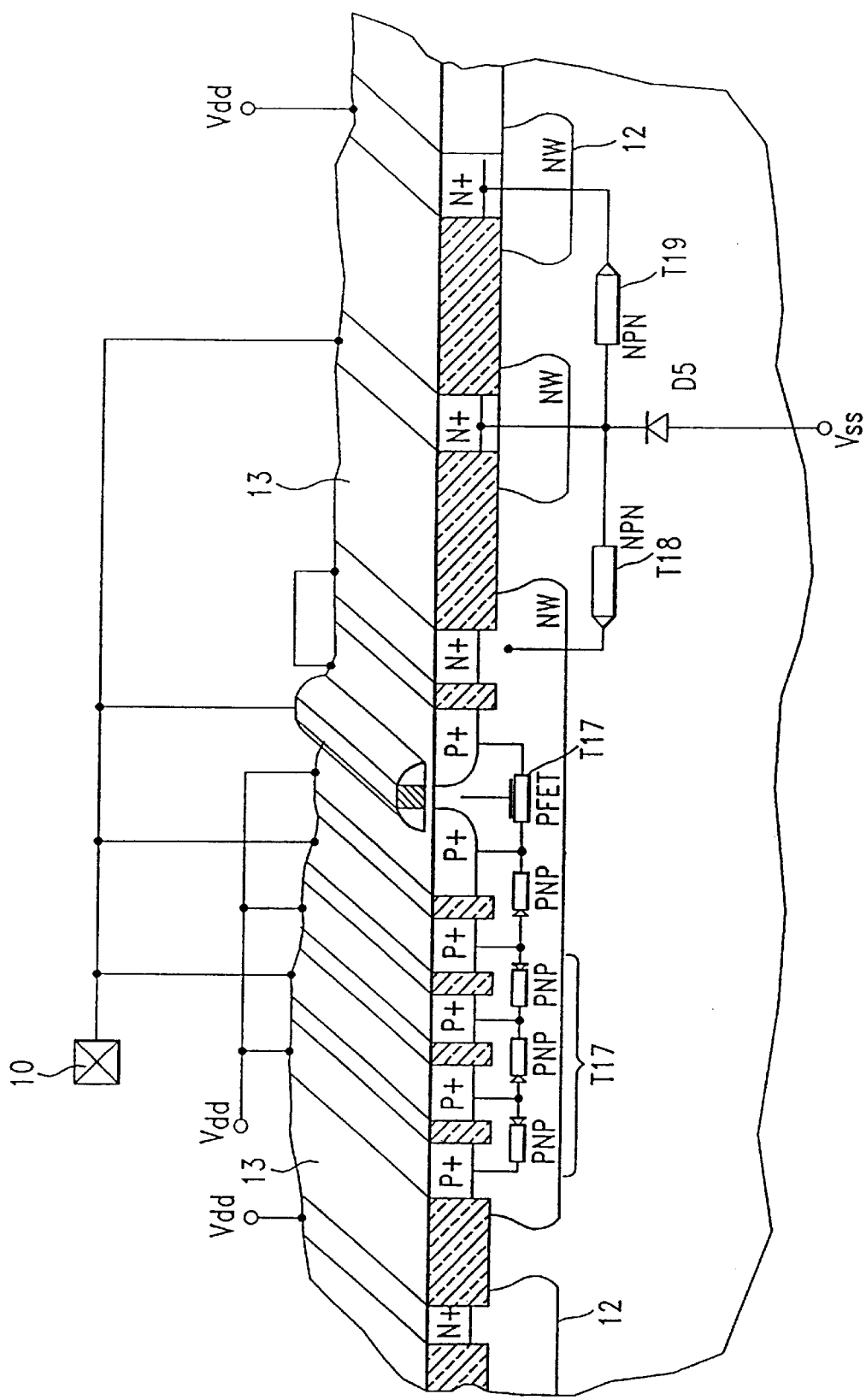
FIG. 4 is schematic representation of a semiconductor device including an input protection circuit of a preferred embodiment of the invention using a self-biased well.
Figure 5:
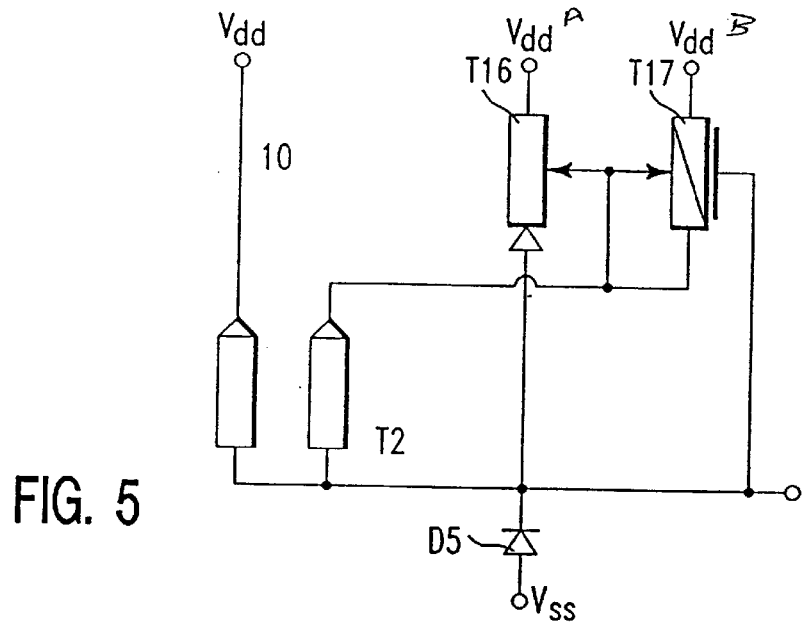
FIG. 5 is an electrical schematic of the circuit of FIG. 4.

An alternative path for ESD protection of power-up sequence independent OCD circuits is a self-biased or floating-well ESD structure. The crux of the invention is integration or synthesizing of the self-biased well concept into a double-diode ESD network forming a power-up sequence-independent ESD network. Two versions were constructed to demonstrate feasibility. FIG. 4 shows the self-biased well ESD network and FIG. 5 shows the electrical schematic of the ESD protection circuit. The ESD network consists of a p+ diode, an n-well biasing p-channel MOSFET T17, a lateral well-to-well npn T18, and an n-well diode D5 each separated by STI regions 13. The n-well bias control p-channel MOSFET T17 is placed next to the p+ diode. A lateral pnp exists between the p+ diode and p+ implants connected to Vdd. The n-well diode D5 is added for negative ESD impulses relative to chip substrate. To provide ESD protection for negative impulses to the power-supply Vdd, an n-well guard ring 12 is placed entirely around the self-bias n-well tub and n-well diode to form a lateral well-to-well bipolar npn transistor.

In normal operation mode, when the data-out node rises above the power supply node voltage Vdd, the n-well bias transistor isolates the n-well tub from the power-supply voltage, allowing the n-well to float. As the p+ diode forward-biases and injects into the well tub, the well tub rises to the data-out node voltage minus the emitter-base voltage of the p+ diode. As a result, the gate of the p-channel n-well bias circuit is not electrically overstressed. DC current will not flow because the p-channel MOSFET gate voltage is well above the p-channel MOSFET threshold voltage.

When Vdd is used as reference ground, the p-channel MOSFET n-well control circuit allows the n-well to float. For the positive HBM impulse, the p+ diode will forward-bias. Holes are injected into the n-well region and diffuse to the p+ diode attached to the grounded Vdd power supply. The retrograde well establishes a potential gradient, deflecting the hole transport vertically to the collector structures. The p+ diode attached to the Vdd power rail capacitively couples to the well, allowing a slower rise to the well structure. When the chip substrate is grounded, the well capacitively couples to the substrate allowing the diode to forward-bias. For negative HBM test mode with respect to Vdd, a lateral npn exists between the n-well diode and the Vdd guard ring and the virtual-well tub. For negative HBM test mode with respect to Vss, the n-well diode forward-biases to chip substrate. The first embodiment was constructed using a 60×3-micron p+ diode in a 120×40-micron area. ESD protection of 2.4 kV and −7 kV was achieved in the positive and negative modes, respectively. An experimental structure was constructed with a thin oxide p-channel MOSFET formed between the p+ diode and the p-channel source of the n-well bias network with no significant improvement. These clear results of the prototype demonstrated that this concept is feasible as an ESD protection network. To improve the self-bias well ESD design, the ESD circuit was implemented into a logic family I/O library that uses power-up sequence-independent CMOS floating well drivers.

THREE-RAIL DISCONNECTED POWER GRID MVI ESD PROTECTION NETWORKS

Figure 6:
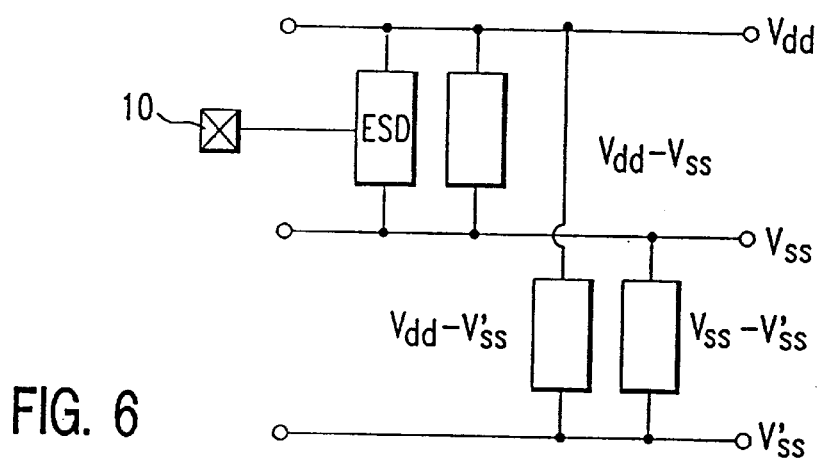
FIG. 6 is an electrical schematic of a two rail ESD embodiment with supply-to-supply ESD networks.
Figure 7:
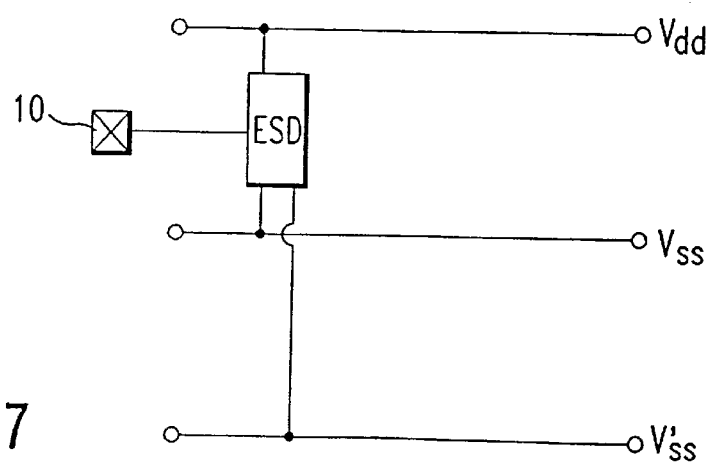
FIG. 7 is an electrical schematic of a three rail ESD network.
Figure 8:
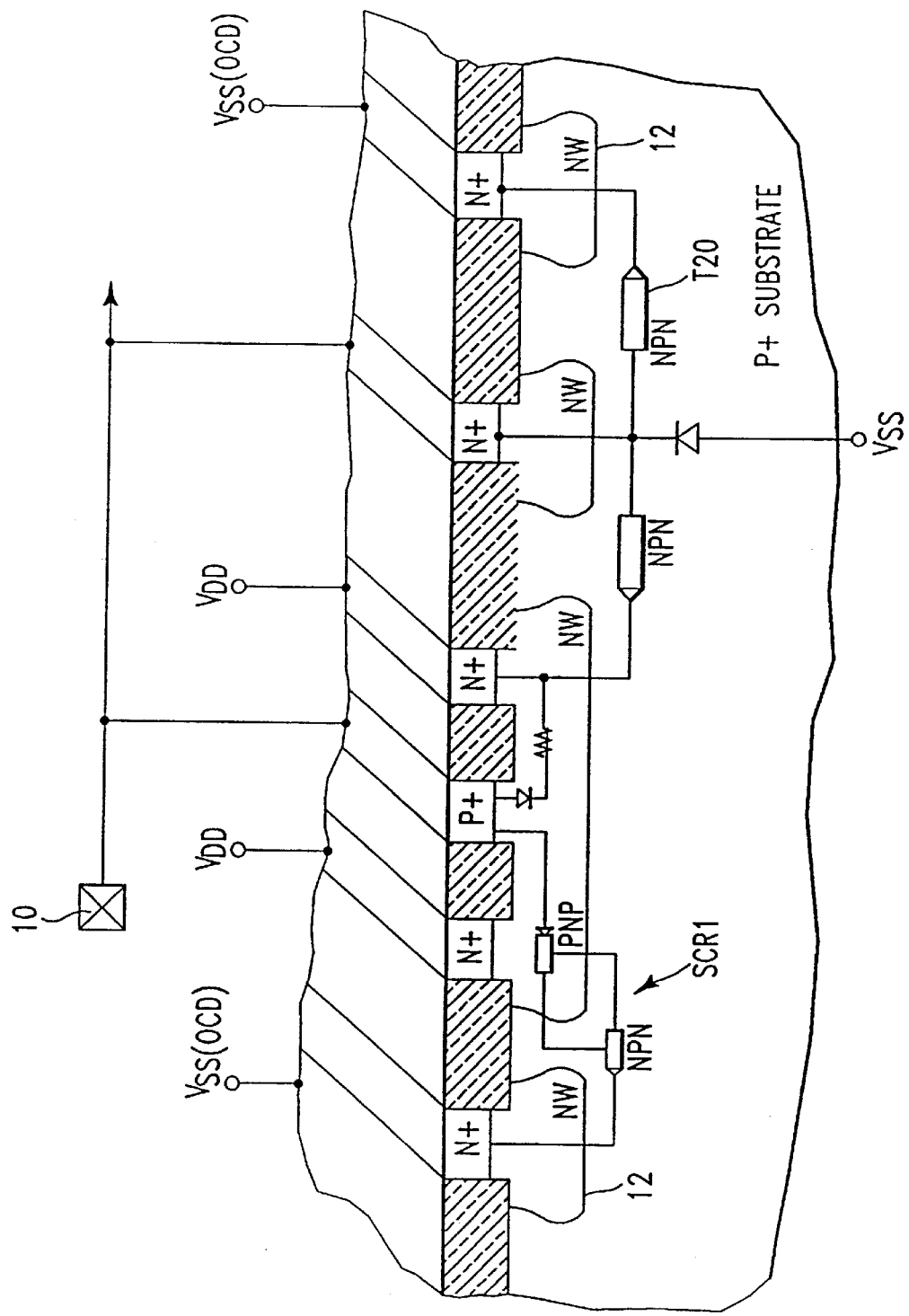
FIG. 8 is a schematic representation of a three-rail hybrid SCR/double diode embodiment of the invention.

ESD protection relative to the other power rails is achieved by establishing connectivity between the power rails with supply-to-supply ESD networks as shown in FIGS. 6 and 7. It is very dependent on the bus architecture and the physical distance between the pad and the grounded power rail pin. Conceptually, connectivity to all power rails can be achieved at the pad itself is preferred. To address ESD protection in multi-rail disconnected power grids, new ESD circuits were designed and implemented. The objective was to achieve ESD protection relative to all power rails local to the pin, which avoids rail-to-rail solutions that jeopardize functionality because of on-chip noise. Therefore, tertiary-rail designs were developed which function in six ESD impulse modes instead of four. In our case, ESD protection to Vdd, Vss, and Vss(OCD) power rails had to be provided for both positive and negative ESD impulses. To address the negative Vss(OCD) HBM fail mechanism, an ESD device needed to be developed that provides ESD protection relative to the Vss(OCD) power rail but does not jeopardize the other ESD protection modes to Vdd and Vss. FIG. 8 shows another embodiment for a dual Vss design which attaches the outer n-well ring 12 to the Vss(OCD) power rail. The ESD network performs as a standard double-diode network to the Vdd and Vss power rails. A lateral npn transistor T20 is formed between the pad and Vss(OCD) power rail for negative HBM impulses with the Vss(OCD) rail at ground. The n-well ring 12 acts as a guard ring for the n-well diode to prevent current flow to the n-channel MOSFET driver circuit. This solution does not require any additional space or capacitance than a standard double-diode design. A SCR pnpn SCR1 is formed between the pad node and Vss(OCD) rail for positive mode Vss(OCD) protection. The SCR is formed by the p+ diode, the n-well, the p+ substrate and the n-well which is tied to Vss(OCD). The structure of FIG. 8 is a hybrid double-diode and SCR pnpn network which uses diodes, transistors and SCRs in a common structure. ESD results over 5 kV were achieved. This design was modified to improve the Vss(OCD) ESD protection levels. A new structure was constructed that extended the n+ implant on the n-well diode and the n-well ring to improve the lateral turn-on of the lateral well-to-well npn. Additionally, for positive impulses, the n+ implant well contact of the n-well tub was extended to improve the SCR pnpn action. The ESD protection of the structure, relative to the Vss(OCD) rail, was +5.6 kV and −2.0 kV for positive and negative modes, respectively. These results were for a n+/n+ space of 1.35 micron. With an n+-to-n+ space of 1.8 micron, ESD robustness of 6.0 and −1.8 kV was observed with the Vss(OCD) rail grounded. Extension of an n+ implant on the n-well diode and n-well ring degrades ESD robustness 1 to 3 kV.

To solve the negative-mode Vss(OCD) fail mechanism, Structure A was implemented into a test chip. ESD protection was improved from −500 V to a range of −3.5 to −10 kV for negative HBM impulses on the OCD pins. The negative mode pin-to-OCD fail mechanism was also delayed to −7000 V. Since the SCR pnpn action is weak in shallow trench isolation designs with low n-well sheet resistances, there was no improvement in the positive HBM ESD mode. Additionally, the structure was implemented between the power rails, using the Vss(OCD) pin as an input; ESD protection between all the power rails improved from 2.4 kV worst-case to greater than 10 kV between all rails. This was achieved without back-to-back diode configurations between Vss and Vss(OCD) to allow for noise isolation.

Figure 9:
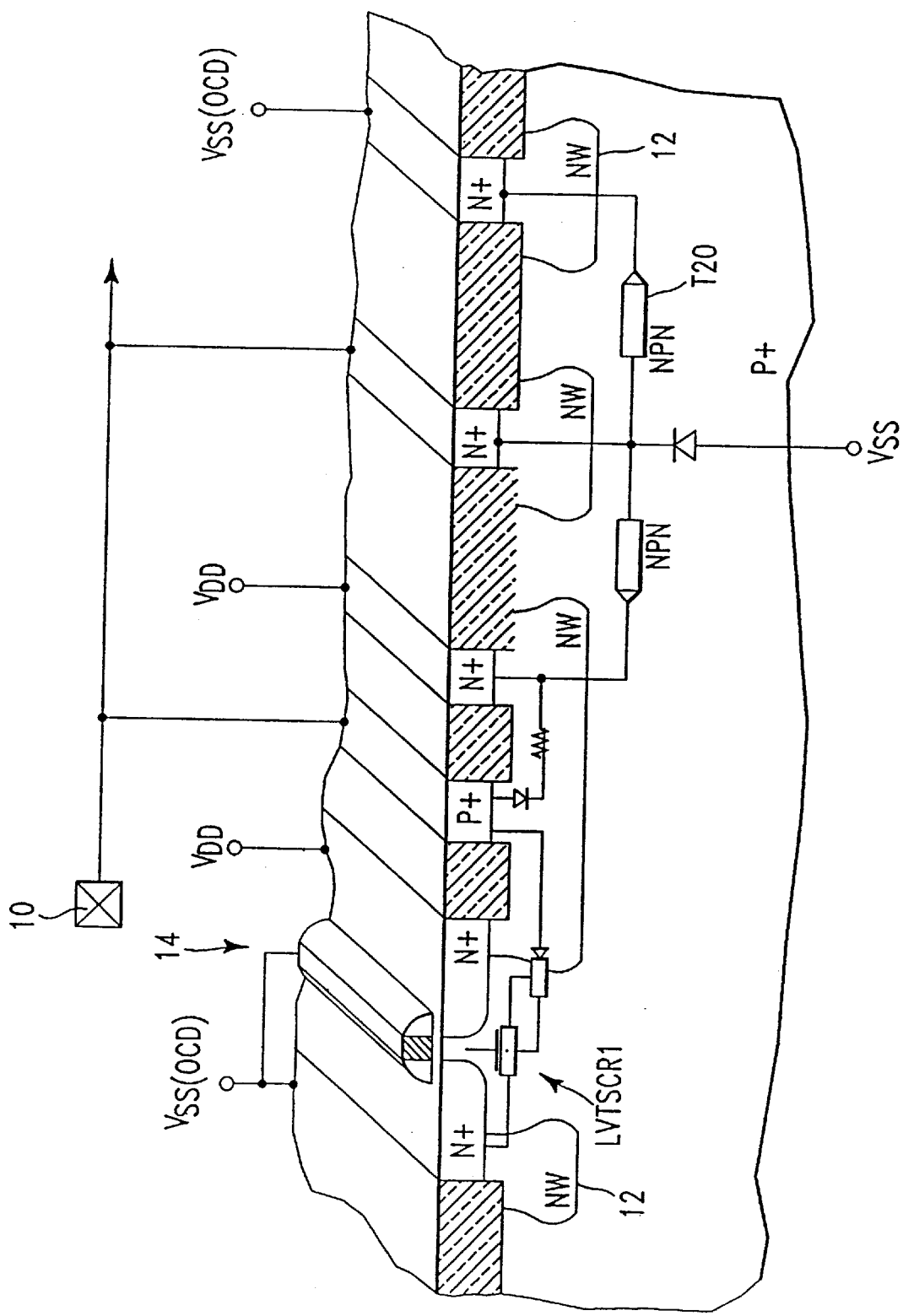
FIG. 9 is a schematic representation of a three-rail hybrid LVTSCR/double diode embodiment of the invention.

An alternate ESD design, as shown in FIG. 9, was also created by adding a low-voltage n-channel MOSFET 14 trigger between the Vss(OCD) n-well and the Vcc n-well to form a low-voltage-triggered SCR (LVTSCR). The design allows early triggering of the SCR in a Vss(OCD) mode with a positive impulse. The ESD circuit of FIG. 9 has no area or capacitance impact to the pad node but does have the possibility of introducing noise coupling between the Vss (OCD) and Vcc rails. Using a 0.675-micron gate length, ESD robustness relative to the Vss(OCD) rail for positive mode protection was 5.4 kV.

Another concept for Vss(OCD) negative protection is inserting a p+ diode into the n-well diode of the double-diode network, not shown, to provide a diode to the Vss (OCD) rail. For this concept, ESD protection of −6.2, −7.6 and −5.8 kV was demonstrated to Vss (OCD) using a 2-micron wide implant within a 4-micron-wide n-well diode. This solution is a viable option to the lateral npn well-to-well concept.

Figure 10:
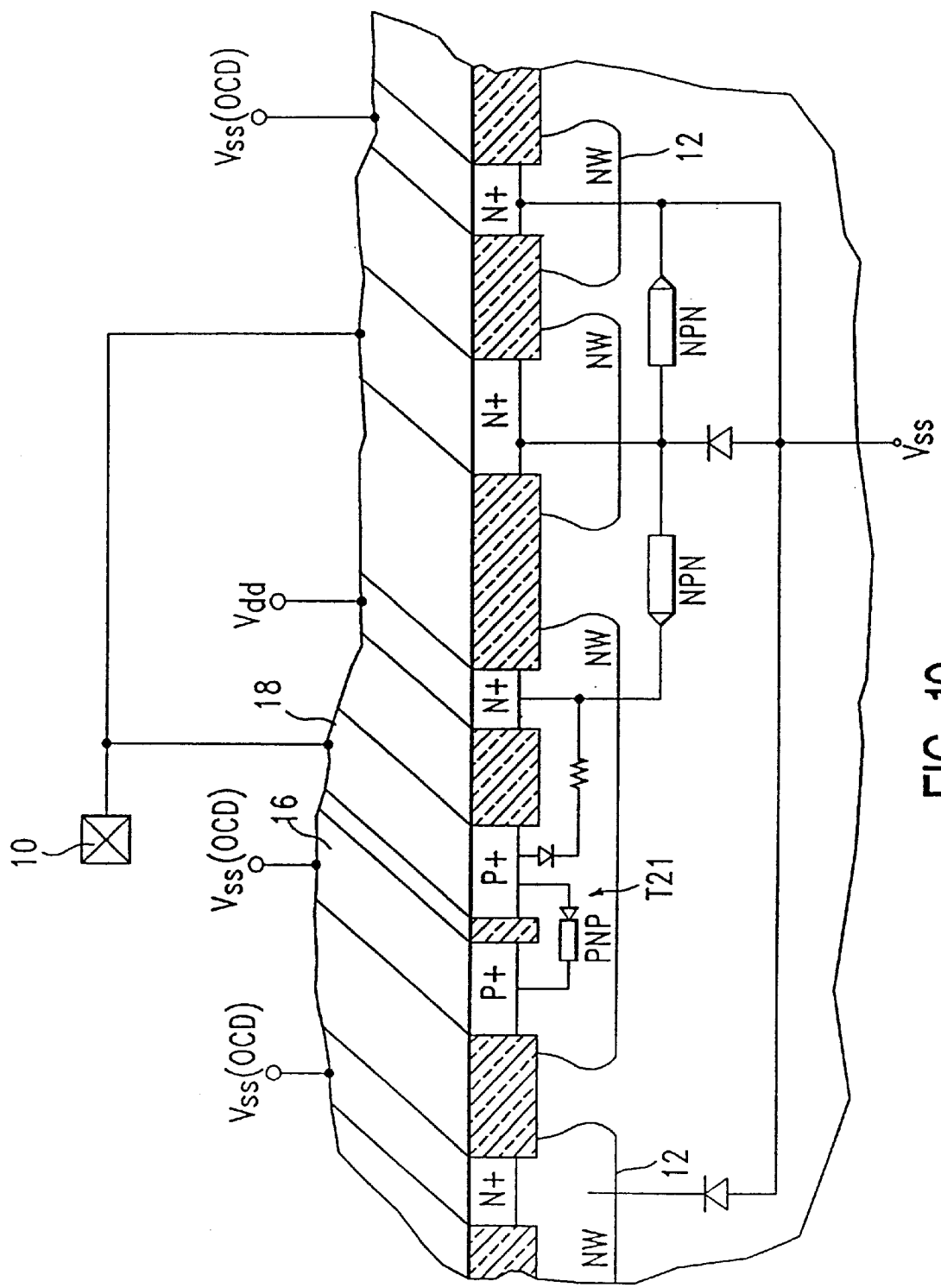
FIG. 10 is a schematic representation of a three-rail lateral PNP/double-diode embodiment of the invention.

Another concept for Vss(OCD) positive protection was to use a lateral shallow trench isolation pnp transistor rather than a SCR. This embodiment is shown in FIG. 10 and utilizes the lateral pnp concept implemented into the self-bias well MVI device. A p+ implant 16 was placed next to the p+ diode 18 of the double-diode network to form a lateral pnp T21 and connected to the Vss(OCD) rail. A p+ diode was also placed in the n-well diode which is connected to the input pad as indicated above. ESD protection of +5.8 kV and −5.8 kV was achieved with respect to the Vss(OCD) pin. In yet another embodiment, a low voltage trigger was placed between the n-well tub attached to Vdd and the n-well ring attached to Vss(OCD); there was no ESD robustness improvement compared to Structure C. This structure used a thin oxide p-channel MOSFET instead of the lateral STI-defined pnp; the p-channel source is attached to the input node, and the drain is attached to Vss(OCD). ESD robustness of only 3.6 kV was achieved.

As an alternate strategy, additional structures used 3-rail pnpn SCR concepts. Tertiary-rail SCR designs were attempted to provide ESD protection to Vcc, Vss and Vss (OCD). ESD protection relative to the Vss(OCD) rail was +1.2 and −1.4 kV for positive and negative HBM impulses for a typical design. ESD robustness could not be successfully achieved with traditional triggered SCR concepts in this multi-rail architecture in the STI-defined latchup hard CMOS technology.

Using the optimum solutions, FIG. 10, a 110×40-micron design that used the lateral pnp concept for Vss(OCD) positive modes and the lateral well-well npn concept for negative Vss(OCD) modes was implemented. ESD robustness for positive HBM impulses was demonstrated to over 8.0 kV with respect to Vss, Vcc and Vss(OCD) power rails. On off-chip driver pins, ESD protection was greater than 10 kV with respect to Vss(OCD), Vss and Vcc. ESD robustness was greater than −8 kV for negative HBM ESD testing relative to Vss (OCD) and −10 kV relative to Vdd and Vss. Address pins, with the lateral pnp disabled, achieved ESD protection over 9 kV in positive HBM test modes. This was achieved with the Vss(OCD) and Vss rails disconnected in a 5-V chip, where the internal chip capacitance is isolated by a voltage regulator from the peripheral busses and a 5-V compatible CMOS OCD. Charge-device model testing (CDM) showed that CDM ESD robustness was greater than 1000 V.

Figure 11:
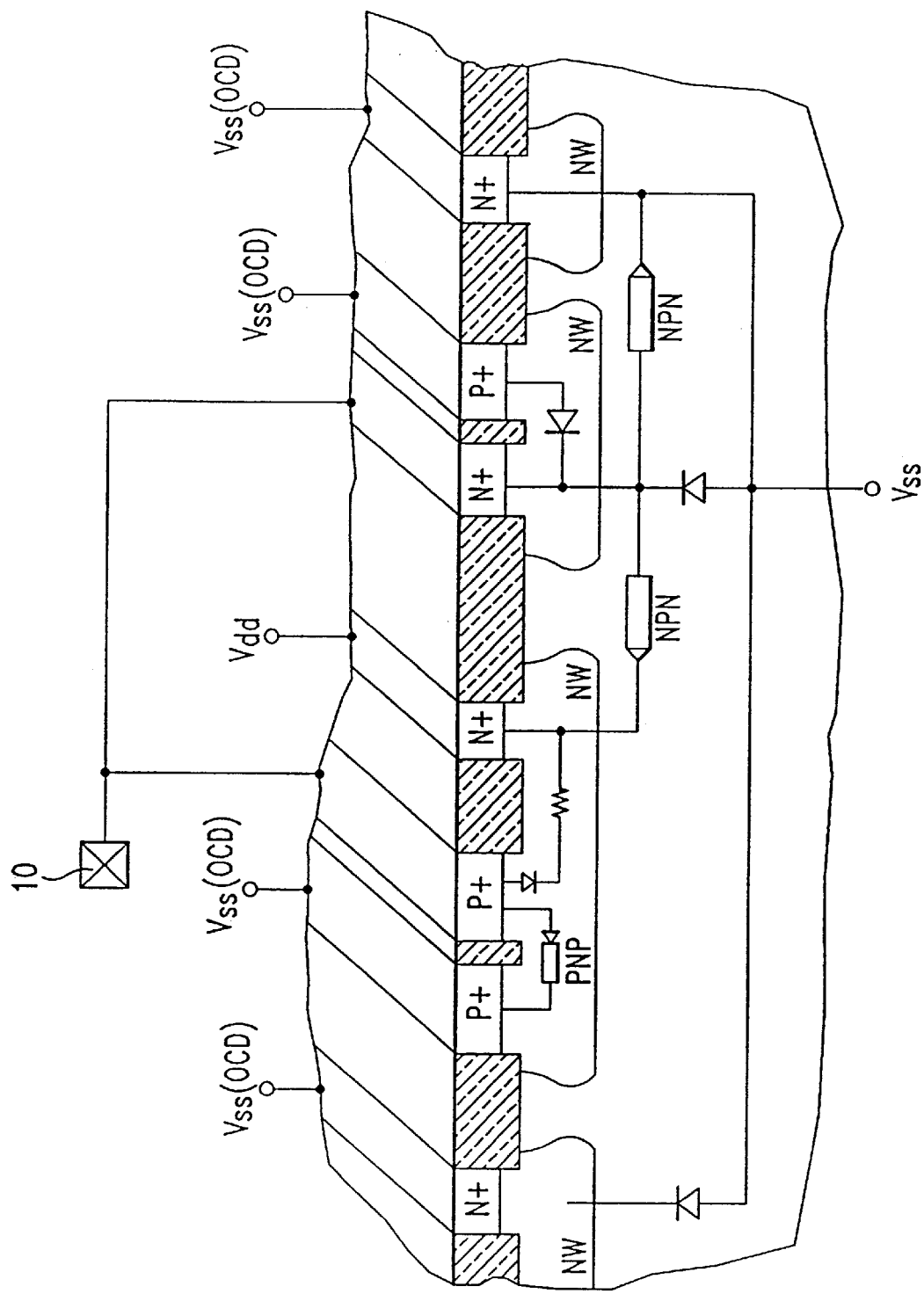
FIG. 11 is a schematic representative of a three-rail hybrid lateral PNP/triple-diode embodiment of the invention.

ESD robustness can be achieved by using three-rail ESD designs in disconnected power-grid structures and maintain noise isolation. This is illustrated in FIG. 11 and is achieved without bi-directional external supply-to-supply networks. This alternative strategy may be advantageous in chip designs with high bus resistances, isolated power grids, and mixed-voltage tolerant chips. These structures may be advantageous for charge device model interaction because having a current path local to the pin produces CDM ESD robustness.

A comparative study was done in 0.5- and 0.25-micron technologies of ESD protection circuits for single- and dual-voltage tolerant chip design. ESD robustness has proven successful with diode-string and floating-well ESD structures in latchup hard shallow-trench isolation technology.

A diode-string ESD protection network was developed for 3.3-V power supply and 5.0 V tolerant I/O for mixed-voltage environments. By using an optimized CMOS shallow trench isolation technology with minimum ground rules, ESD robustness over 6 kV was achievable for power-up sequence dependent environments.

A floating-well ESD protection circuit was developed for ASIC applications, advanced microprocessors, cold sparing environments, and power-up sequence independence. When used in conjunction with a floating-well CMOS driver circuit, ESD robustness of 6 to 9 kV was achieved in an advanced CMOS 0.5-micron technology. ESD robustness was superior to traditional ESD network solutions (e.g., SCR, LVTSCR, pi-network). The self-biased well ESD network has considerable value for low-power and low-voltage LOCOS and STI-defined CMOS technologies.

For advanced DRAM and logic technologies, power-grid connectivity was eliminated to increase noise margin to critical circuits. New ESD circuits have been developed to address new fail mechanisms in disconnected power grid environments. As power-supply voltages continue to decrease, tradeoffs of noise isolation versus ESD robustness will be a growing issue. Tertiary-rail ESD structures have shown effective in eliminating fail mechanisms, preserving noise isolation and achieving adequate ESD robustness over 8 kV. These concepts could be synthesized with the virtual well ESD circuits providing mixed voltage solutions in disconnected power grids .

Another conceptual direction is to provide ESD protection to all rails at the pin by developing protection circuits that have ESD protection to multiple power rails in a single-stage ESD structure. In the next sections, standard and novel ESD structures will be shown, highlighting the relationship of ESD devices and power bussing.

While the invention has been described in terms of a limited number of embodiments, those skilled in the art will appreciate that various changes and substitutions can be made without diluting the scope of the invention.

What is claimed is:

1. A semiconductor chip comprising:
   a substrate;
   a first power supply rail connected to ground for off-chip drivers, a second power supply rail connected to circuit ground, and a third power supply rail connected to Vdd;
   a pad; and an ESD protect circuit comprising a first well biased through an FET so that said ESD circuit is not forward biased during normal operation when the voltage on said pad rises above a rail voltage.

2. A semiconductor chip as recited in claim 1, wherein said FET has a gate connected to said pad, a source connected to VDD, and a drain connected to said first well, said structure further comprising:

a second well connected to said pad;

a third well connected to one of said first, second, and third rail.

3. A semiconductor chip as recited in claim 2, wherein said first, second, and third wells are first, second, and third n wells respectively and said FET is a PFET, said structure further comprising:

a lateral PNP having an emitter connected to said pad, a base connected to said first n well, and a collector connected to one of said first, said second, and said third rail;

an NPN transistor having an emitter connected to one of said first second and third rail, a base connected to said substrate, and a collector connected to said pad;

an NPN transistor having an emitter connected to said first n well, a base connected to said substrate, and a collector connected to said pad; and a diode connected between pad and substrate.

4. A semiconductor chip as recited in claim 3, wherein said diode is the junction between said second n well and substrate.

* * * * *